(12) United States Patent
Shakuda

(10) Patent No.: US 7,939,833 B2
(45) Date of Patent: May 10, 2011

(54) NITRIDE SEMICONDUCTOR LIGHT EMITTING DEVICE

(75) Inventor: Yukio Shakuda, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 339 days.

(21) Appl. No.: 12/085,516

(22) PCT Filed: Nov. 28, 2006

(86) PCT No.: PCT/JP2006/323680
§ 371 (c)(1),
(2), (4) Date: May 27, 2008

(87) PCT Pub. No.: WO2007/063832
PCT Pub. Date: Jun. 7, 2007

(65) Prior Publication Data
US 2009/0166668 A1    Jul. 2, 2009

(30) Foreign Application Priority Data
Nov. 29, 2005   (JP) .................. 2005-343963

(51) Int. Cl.
*H01L 27/15* (2006.01)
*H01L 31/12* (2006.01)
*H01L 33/00* (2010.01)

(52) U.S. Cl. .............. 257/79; 257/96; 257/97; 257/103; 257/E33.028; 257/E33.033

(58) Field of Classification Search .................. 257/79, 257/96, 97, 103, E33.028, E33.033
See application file for complete search history.

(56) References Cited

U.S. PATENT DOCUMENTS
6,656,604 B2   12/2003   Hasewaga
6,995,389 B2 *  2/2006   Kim et al. ................... 257/13

FOREIGN PATENT DOCUMENTS
JP   10-173222   6/1998
JP   2003-195237   7/2003

* cited by examiner

*Primary Examiner* — Thien F Tran
(74) *Attorney, Agent, or Firm* — Rabin & Berdo, PC

(57) ABSTRACT

There is provided a nitride semiconductor light emitting device having high internal quantum efficiency by accelerating recombination radiation while employing a multiple quantum well structure in which each of well layers has a relatively large thickness. The nitride semiconductor light emitting device is provided with a nitride semiconductor lamination portion (6) provided on a substrate (1). The nitride semiconductor lamination portion (6) includes at least an active layer (4) in which a light emitting portion is formed. And the active layer is constituted with a multiple quantum well structure formed by laminating well layers (7) made of $In_xGa_{1-x}N$ ($0<x\leq1$), and barrier layers (8) made of $Al_yIn_zGa_{1-y-z}N$ ($0\leq y<1$, $0\leq z<1$, $0\leq y+z<1$, $z<x$) alternately. In addition, one of the well layers is divided at least into a first well layer (7a) and a second well layer (7b) by a thin film barrier layer (7c) made of $Al_vIn_wGa_{1-v-w}N$ ($0\leq v<1$, $0\leq w<1$, $0\leq v+w<1$, $w<x$), and the thin film barrier layer is formed so as to have a thickness of one atomic layer or more and 20 Angstroms or less.

13 Claims, 3 Drawing Sheets (a)

(b)

NITRIDE SEMICONDUCTOR LIGHT EMITTING DEVICE

FIELD OF THE INVENTION

The present invention relates to a semiconductor light emitting device using nitride semiconductor, such as a light emitting device like a light emitting diode (LED), a laser diode (LD) or the like. More particularly, the present invention relates to a nitride semiconductor light emitting device capable of realizing low threshold current and low driving current and voltage operation, by enhancing light emitting efficiency at a well layer composing an active layer in a semiconductor light emitting device having an active layer with a multi quantum well structure.

BACKGROUND OF THE INVENTION

In recent years, nitride semiconductor light emitting devices such as a blue light emitting diode (LED), a laser diode or the like, using nitride semiconductor, have been in practical use, and here a multi quantum well structure is employed in order to enhance light emitting efficiency at an active layer to achieve high luminance and high output. As shown, for example, in FIG. 4, in the LED emitting blue light using nitride semiconductor, a semiconductor lamination portion 36 is formed by laminating semiconductor layers, on a sapphire substrate 31, by a MOCVD method. The semiconductor lamination portion 36 includes a low temperature buffer layer 32 made of GaN or the like, an n-type layer 33 made of GaN or the like, a multi quantum well (MQW) active layer (light emitting layer) 34 formed by laminating alternately well layers 37 made of a material which has a smaller band gap energy than that of the n-type layer 33 and decides a wavelength of emitted light, such as, for example, InGaN based (which means that a ratio of In to Ga can be varied variously and the same applies hereinafter) compound semiconductor, and barrier layers 38 made of GaN or AlInGaN based (which means that a ratio of Al, In and Ga can be varied variously and the same applies hereinafter) compound semiconductor, and a p-type layer 35 made of GaN or the like. Then, a p-side electrode 41 is provided on a surface thereof interposing a light transmitting conductive layer 40, and an n-side electrode 42 is provided on a surface of the n-type layer 33 exposed by etching a part of the semiconductor lamination portion 36 laminated.

In addition, a semiconductor layer having still larger band gap energy such as an AlGaN based (which means that a ratio of Al to Ga can be varied variously and the same applies hereinafter) compound or the like may be used on the active layer side of the n-type layer 33 and the p-type layer 35 in order to increase an effect of carrier confinement (cf. for example PATENT DOCUMENT 1).

PATENT DOCUMENT 1: Japanese Patent Application Laid-Open No. H10-173222 (cf. FIG. 1)

DISCLOSURE OF THE INVENTION

Problem to be Solved by the Present Invention

As described above, if the active layer is formed with a multi quantum well structure, since quantum levels are formed in the active layer (well layer), electrons and holes are apt to generate recombination radiation by a few current (electrons and holes) injection, then a semiconductor light emitting device with high efficiency comparing to a bulk structure can be obtained. However, even if a device is actually manufactured by employing an active layer having a multi quantum well structure made of nitride semiconductor, there is a problem such that light emitting efficiency can not be enhanced so high as a theoretical value.

In addition, in recent years, a long wavelength semiconductor light emitting device such as, for example, a device emitting green light has been developed, however, in order to manufacture such device, since a band gap energy of an active layer is lowered (lengthen a wavelength), a method of increasing a composition of In of an InGaN based compound semiconductor layer constituting an active layer may be suggested. However, if the composition of In of the active layer is increased, since In is unevenly distributed in the active layer, a desired wavelength can not be obtained, and crystallinity is deteriorated by increasing of the composition of In, and then light emitting efficiency is lowered corresponding to lengthening a wavelength. Therefore, as another method, an idea may be suggested such that a thickness (width) of a well layer is increased while employing the above-described quantum well structure. However, if a thickness of the well layer is increased, light emitting efficiency can not be enhanced so high as a theoretical value as described above, and it is more noticeable than in case of a short wavelength semiconductor light emitting device of blue or ultraviolet light, then there arises a problem such that a semiconductor light emitting device with high efficiency can not be obtained.

The present invention is directed to solve the above-described problems and an object of the present invention is to provide a nitride semiconductor light emitting device having high light emitting efficiency by accelerating recombination radiation (light emitting) while employing a multiple quantum well structure in which each of well layers has a relatively large thickness.

Means for Solving the Problem

As a result of earnest and repeated studies and examinations of a cause why light emitting efficiency can not be enhanced so high as a theoretical value even when the active layer is formed with a multi quantum well structure, the present inventor discovered that, in case of using nitride semiconductor for the active layer of a multi quantum well structure, a strain in the active layer is large, energy levels within the active layer have an uneven distribution by the strain, and by the distribution, electrons and holes are unevenly distributed. Namely, in the active layer with a multi quantum well structure made of nitride semiconductor, since lattice constants are largely different between the well layer and the barrier layer, strain generates within the active layer, and energy levels become different within the well layers (cf. a band figure of FIG. 3). In addition, it is discovered that, since electrons in a conduction band and holes in a valence band are apt to stay at a stable position in energy levels up to the most, an existing distribution of the electrons and that of the holes are different (a position where electrons in a conductive band stays densely is different from a position where holes in a valence band stays densely) within the well layer, thereby recombination does not occur efficiently in the well layer, and light emitting efficiency can not be enhanced so high as the theoretical value.

Then it is discovered that in order to solve such distribution, by dividing a well layer by interposing a nitride semiconductor thin film (thin film barrier layer) having larger band gap energy than that of the well layer within the well layer, electrons and holes become to exist at interfaces of the thin film barrier layer and the well layers divided, and since the thin film barrier layer is very thin layer and the electrons and the holes become to approach each other, recombination radiation can be accelerated.

More concretely, as shown in FIG. 3(a), if the active layer has a usual MQW structure, by a strain caused by difference of lattice constants between the well layer and the barrier layer, an energy level of the conductive band in the well layer becomes low at a region near the n-type layer side, and high toward the p-type layer. On the other hand, an energy level of a valence band becomes high at a region near the p-type layer side, and low toward the n-type layer. Therefore, in case such that electrons supplied from the n-type layer side and holes supplied from the p-type layer side generate recombination radiation in the well layer, a density of the electrons is high (high electron existing probability) at a side (low energy side) near the p-type layer in the well layer, and a density of the holes is high (high hole existing probability) at a side (high energy side) near the n-type layer in the well layer, as shown in FIG. 3(a), then positions where the electrons and the holes exist stably are different in the well layer. As a result, the recombination radiation by the electrons and the holes does not generate efficiently, and luminance efficiency can not be enhanced.

On the other hand, as shown in FIG. 3(b), by dividing the well layer into at least the first well layer and the second well layer by interposing the thin film barrier layer having a larger band gap energy than that of the well layer within the well layer, since movement of electrons and holes in the well layer is stopped by the thin film barrier layer, a density of the electrons becomes high in a conductive band in the vicinity of an interface of the first well layer divided by the thin film barrier layer and the thin film barrier layer, and a density of the holes becomes high in a valence band in the vicinity of an interface of the second well layer divided and the thin film barrier layer. Then, since the thin film barrier layer is a very thin layer, regions where densities of electrons and holes are high approach each other, and efficiency of the recombination radiation can be enhanced.

A nitride semiconductor light emitting device according to the present invention includes a substrate, and a nitride semiconductor lamination portion provided on the substrate, the nitride semiconductor lamination portion comprising an active layer in which at least a light emitting portion is formed, the active layer being constituted with a multiple quantum well structure formed by laminating well layers made of $In_xGa_{1-x}N$ ($0<x\leq1$) and barrier layers made of $Al_yIn_zGa_{1-y-z}N$ ($0\leq y<1$, $0\leq z<1$, $0\leq y+z<1$, $z<x$) alternately, wherein one of the well layers is divided at least into a first well layer and a second well layer by a thin film barrier layer made of $Al_vIn_wGa_{1-v-w}N$ ($0\leq v<1$, $0\leq w<1$, $0\leq v+w<1$, $w<x$), the thin film barrier layer being formed so as to have a thickness of one atomic layer or more and 20 Angstroms or less.

Here, the nitride semiconductor means a semiconductor made of a compound of Ga of group III element and N of group V element or the compound in which a part or all of Ga of group III element is substituted by other element of group III element like Al, In or the like and/or the compound (nitride) in which a part of N of group V element is substituted by other element of group V element like P, As or the like.

It is preferable that each thickness of the first well layer and the second well layer is ($b_1$+10) Angstroms or more and 100 Angstroms or less, wherein the thickness of the thin film barrier layer is $b_1$ Angstroms, and a thickness of the barrier layer is 50 Angstroms or more and 100 Angstroms or less, because, while maintaining a quantum effect of a multi quantum well structure, recombination radiation can be accelerated.

Effect of the Invention

According to the present invention, since the thin film barrier layer having a larger band gap energy than that of the well layer is provided within the well layer, the well layer is divided into at least the first well layer and the second well layer by the thin film barrier layer, a barrier effect against electrons and holes is generated by the thin film barrier layer, the electrons and the holes approach each other at the first well layer and the second well layer interposing the thin film barrier layer, and, as a result, recombination radiation can be accelerated between the electrons and the holes existing in the first well layer and the second well layer divided.

In addition, since a thickness of the thin film barrier layer is set 20 Angstroms or less, a function of the well layer is not spoiled by imposing of the thin film barrier layer, and an effect of a conventional well layer can be maintained. Therefore, a semiconductor light emitting device with significantly high luminance efficiency can be obtained comparing to that in case of using a usual MQW active layer. In addition, in case of forming a light emitting device such as a green or yellow LED in which a thickness of a well layer is large, luminance efficiency never lowers. As a result, even if a LED, LD or the like emitting ultraviolet to yellow light, a semiconductor light emitting device with high characteristics having high internal quantum efficiency and a low threshold current can be obtained.

EXPLANATION OF LETTERS AND NUMERALS

Figure 1:
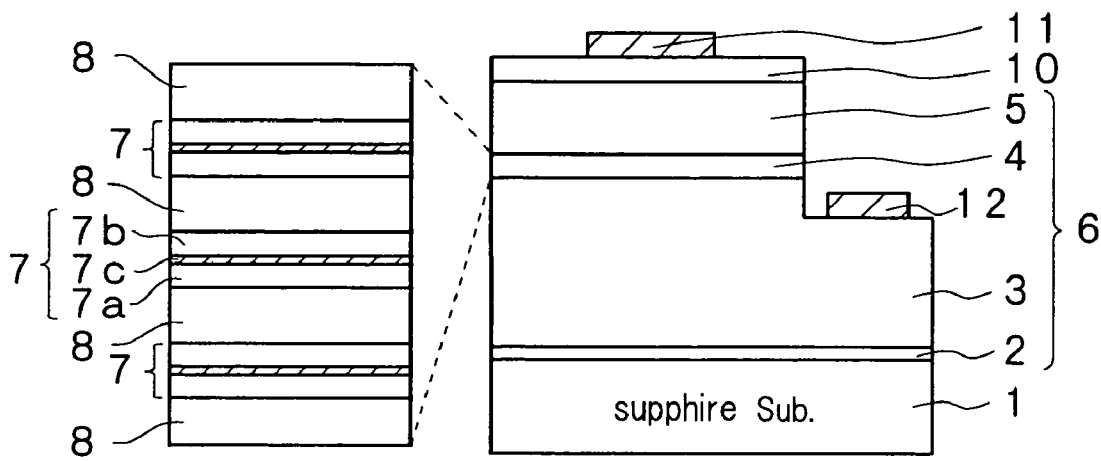
FIG. 1 is an explanatory cross-sectional view of a LED which is an embodiment of the nitride semiconductor device according to the present invention.

1: substrate
3: n-type layer
4: active layer
5: p-type layer
6: semiconductor lamination portion
7: well layer
7a: first well layer
7b: second well layer
7c: thin film barrier layer
8: barrier layer

THE BEST EMBODIMENT OF THE PRESENT INVENTION

An explanation will be given below of a nitride semiconductor light emitting device according to the present invention in reference to the drawings. As an explanatory cross-sectional view of the nitride semiconductor light emitting device (LED chip) of an embodiment is shown in FIG. 1, the nitride semiconductor light emitting device according to the present invention is provided with a nitride semiconductor lamination portion 6 provided on a substrate 1. The nitride semiconductor lamination portion 6 includes at least an active layer 4 in which a light emitting portion is formed. And the active layer 4 is constituted with a multiple quantum well structure formed by laminating well layers 7 made of $In_xGa_{1-x}N$ ($0<x\leq1$), and barrier layers 8 made of $Al_yIn_zGa_{1-y-z}N$ ($0\leq y<1, 0\leq z<1, 0\leq y+z<1, z<x$) alternately. In addition, one of the well layers 7 is divided at least into a first well layer 7a and a second well layer 7b by a thin film barrier layer 7c made of $Al_vIn_wGa_{1-v-w}N$ ($0\leq v<1, 0\leq w<1, 0\leq v+w<1, w<x$), and the thin film barrier layer 7c is formed so as to have a thickness of one atomic layer or more and 20 Angstroms or less. In addition, substrates in all figures including FIG. 1 are drawn thin comparing to other semiconductor layers, however a thickness of the substrate 1 is actually much larger than that of each semiconductor layer.

In an example shown in FIG. 1, concretely, the nitride semiconductor lamination portion 6 is formed with a buffer layer 2 and a light emitting layer formation portion constituted with a double hetero junction structure in which an active layer 4 made of a material having a band gap energy corresponding to a light wavelength is sandwiched with layers (n-type layer 3 and p-type layer 5) having larger band gap energies than that of the active layer are provided on an upper side and a lower side of the active layer. And in the present invention, the active layer 4 is constituted with a multi quantum well structure formed by laminating the well layer 7 and the barrier layer 8 repeatedly, furthermore, the well layer 7 is composed of at least the first well layer 7a and the second well layer 7b which are divided by the thin film barrier layer 7c, and the thin film barrier layer 7c is formed with a very thin thickness of one atomic layer or more and 20 Angstroms or less.

Namely, when the active layer with a multi quantum well structure is provided, since discrete quantum levels are formed in the active layer and recombination radiation generates even by a few electrons and holes, operation can be achieved at a low threshold current and a low driving current and voltage, however, in case of the nitride semiconductor light emitting device, efficiency is not enhanced so high as a theoretical value. Then, as a result of earnest and repeated studies, the present inventor found, as described above, that when the active layer with a multi quantum well layer structure is formed by using nitride semiconductor as shown in FIG. 3(a), a large strain occurs in the active layer, thereby electrons and holes within the active layer (within the well layers) are distributed unevenly, and existing positions of electrons and holes within the active layer are shifted in a direction of a thickness of the well layer, therefore recombination radiation with high efficiency can not be achieved.

Figure 3:
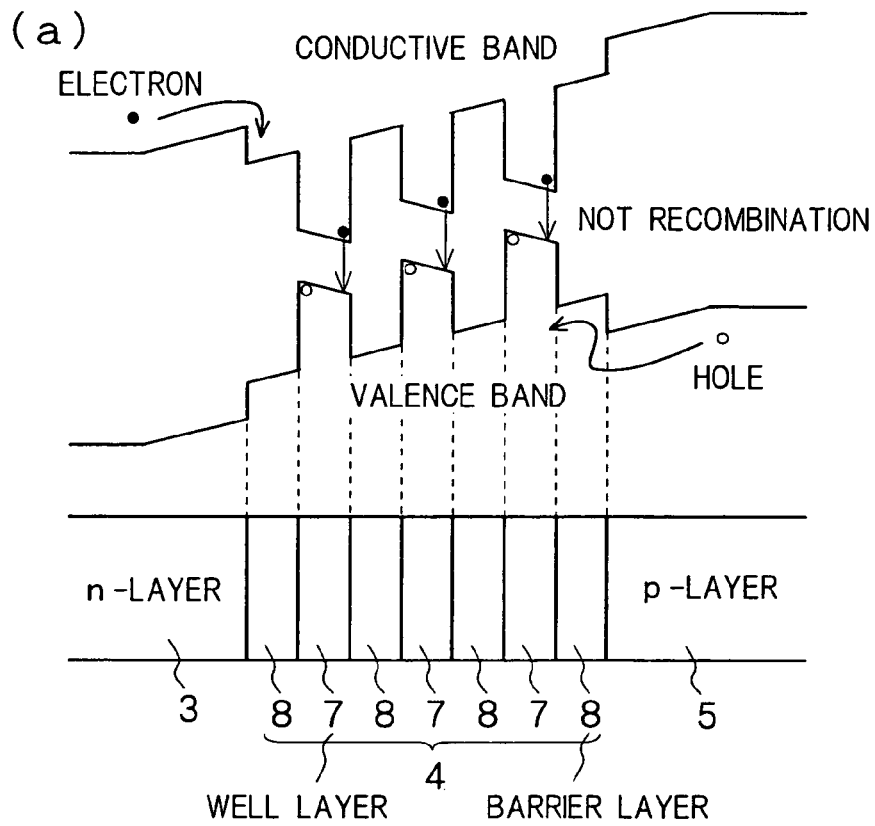
FIG. 3 is a band gap energy figure of the vicinity of the active layer according to the present invention, and a figure explaining a device structure corresponding thereto.
Figure 3:
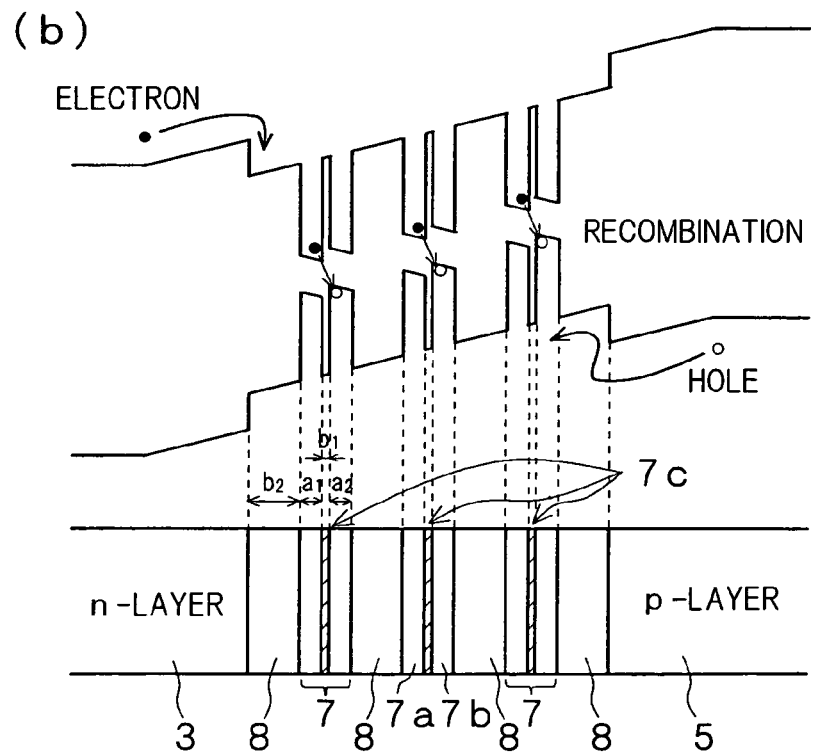
Figure 4:
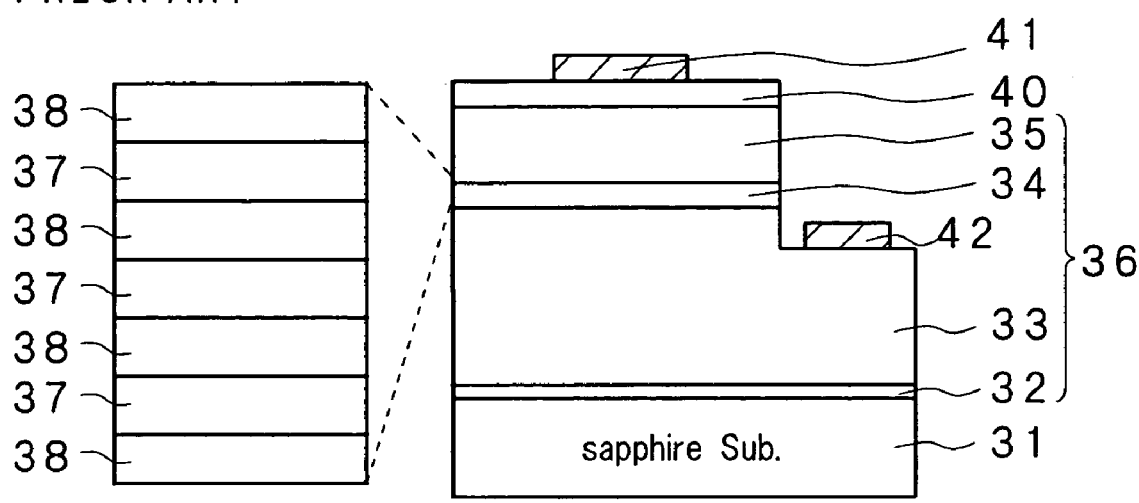
FIG. 4 is a figure of an example of a conventional constitution of a LED using nitride semiconductor.

In addition, as shown in FIG. 3(b), by dividing the well layer 7 into at least two parts of a first well layer 7a and a second well layer 7b by providing a thin film barrier layer 7c having a larger band gap energy than that of an inherent well layer within the well layer 7 and having a thickness of one atomic layer or more and 20 Angstroms or less, electrons injected from the n-type layer 3 side are distributed in the vicinity of an interface of the first well layer 7a and the thin film barrier layer 7c, and holes injected from the p-type layer 5 side are distributed in the vicinity of an interface of the second well layer 7b and the thin film barrier layer 7c. And, since the thin film barrier layer 7c is a very thin layer having a thickness of one atomic layer or more and 20 Angstroms or less, existing positions of the electrons and the holes approach each other very closely in a direction of a thickness of the well layer, and the recombination radiation becomes to occur actively. As a result, a device capable of emitting light with higher efficiency than usual can be obtained.

The thin film barrier layer 7c is provided within the well layer 7, made of $Al_vIn_wGa_{1-v-w}N$ ($0\leq v<1, 0\leq w<1, 0\leq v+w<1, w<x$), and formed of nitride semiconductor having a higher band gap energy than that of the inherent well layer. A reason why the band gap energy is set higher than that of the inherent well layer is to achieve a function of a barrier at an interface against electrons and holes. Therefore, in order to give a barrier effect, it is preferable that the band gap energy is concretely higher than that of the original well layer by 0.4 eV or more. In addition, the thin film barrier layer 7c may be made with the same composition as that of the barrier layer 8 and may be made of $In_{x2}Ga_{1-x2}N$ ($0<x2<x$) by changing the composition. In addition, a position where the thin film barrier layer is provided in a well layer may be a center portion of the well layer to divide the well layer equally into two parts, and a plurality of thin film barrier layers 7c may be provided to divide the well layer into three or more parts. In case of dividing into two parts at a center portion, light is emitted by a mutual action of two divided well layers, and in case of dividing into three or more parts, light is emitted by a mutual action of three or more divided well layers.

Here, a thickness of the thin film barrier layer 7c is set to one atomic layer or more and 2 nm or less. A reason of setting the film thickness to 2 nm or less is that if the thickness is larger than it, displacement of density distributions of electrons and holes in the well layer becomes larger, and light emitting efficiency can not be enhanced. In addition, also in order not to spoil an effect of the first and second well layers 7a and 7b divided by imposing the thin film barrier layer 7c, it is preferable that the thickness is not so large, and concretely a thickness of 1.5 nm or less is more preferable. In addition, the thin film barrier layer 7c may be doped or undoped. In an example shown in FIG. 1, concretely, the thin film barrier layer is approximately 1 nm thick and made of undoped $Al_vIn_wGa_{1-v-w}N$ ($0\leq v<1, 0\leq w<1, 0\leq v+w<1, w<x$; for example $v=w=0$).

The first and second well layers 7a and 7b are made of $In_xGa_{1-x}N$ ($0<x\leq1$), divided by the thin film barrier layer 7c, and formed with each thickness $w_1$ and $w_2$ of ($b_1+1$) nm or more and 10 nm or less, wherein $b_1$ is a thickness of the thin film barrier layer 7c. In case of ($b_1+1$) nm or less, since a ratio of the thin film barrier layer 7c occupying the well layer 7 becomes too large, a function of the well layer by the first and second well layers 7a and 7b is spoiled in total. For example, if the first and second well layers 7a and 7b are narrow (thin), a mutual action of electrons and holes in the well layer becomes large. If a distribution is uneven, an influence of uneven distribution is small when the well is narrow. In addition, it is preferable to set the thickness to 10 nm or less because a quantum effect can function sufficiently. In addition, the first and second well layers 7a and 7b may be undoped or doped in an n-type or a p-type. In addition, thicknesses of the first and second well layers 7a and 7b may be different by being divided by the thin film barrier layer 7c. Concretely, in an example shown in FIG. 1, the well layers 7a and 7b divided are respectively made of, for example, undoped $In_xGa_{1-x}N$ ($0<x\leq1$; for example $x=0.12$) approximately 3 nm thick.

The barrier layer 8 is formed of $Al_yIn_zGa_{1-y-z}N$ ($0\leq y<1, 0\leq z<1, 0\leq y+z<1, z<x$) and with a thickness $b_2$ of 3 to 20 nm, preferably approximately 5 to 10 nm, which is approximately a total of a thickness $w_1$ of the first well layer 7a and a thickness $w_2$ of the second well layer 7b, from the view point of maintaining confinement of carriers of electrons or holes and a quantum effect. Also, the barrier layer 8 may be undoped or doped. Concretely, in an example shown in FIG.

1, the barrier layer 8 is made of undoped $Al_yIn_zGa_{1-y-z}N$ ($0 \leq y<1$, $0 \leq z<1$, $0 \leq y+z<1$, $z<x$; for example y=z=0) approximately 6 nm thick.

In the example shown in FIG. 1, three pairs of the well layer 7 including the thin film barrier layer 7c, and the barrier layer 8 are laminated, however the number of the pairs is not limited to this, and two to eight pairs may be laminated with a thickness of approximately 0.01 to 0.3 μm in total, thereby the active layer 4 with a multi quantum well structure is formed. In addition, in the example shown in FIG. 1, the barrier layers 8 exist as each end part of the active layer 4, however, not being limited to the structure, the active layer may be formed with any one of constitutions formed by beginning with a well layer and ending with a well layer, by beginning with a well layer and ending with a barrier layer, by beginning with a barrier layer and ending with a well layer, and by beginning with a barrier layer and ending with a barrier layer. In addition, since compositions and materials of the well layer and the barrier layer constituting the active layer 5 are specified by a wavelength of light emitted, they can be changed properly.

In an example shown in FIG. 1, the n-type layer 3 and the p-type layer 5 are made with a $Al_xGa_{1-x}N$ ($0 \leq s<1$; for example s=0.07) layer which has a larger band gap energy than that of the active layer 4 and provided to function as barrier layers confining carriers within the active layer 4. However, not being limited to such constitution, it is enough to provide an n-type layer and a p-type layer so as to emitting light in the active layer. The n-type layer 3 is provided with a thickness of approximately 0.1 to 10 μm and the p-type layer 5 is provided with a thickness of approximately 0.1 to 10 μm. The n-type layer 3 and the p-type layer 5 may have the same composition or different compositions, and materials thereof are not limited to this material. In addition, the n-type layer 3 and the p-type layer 5 are not limited to a single layer, and there may be provided, for example, a light guide layer or the like at a boarder portion with the active layer, an $Al_sGa_{1-s}N$ layer having a larger band gap energy at the active layer side and a GaN layer at an opposite side in order to improve carrier confinement, or a reflection layer or the like within each layer. In addition, whole of them may be formed of GaN.

In order to form in n-type conductivity, Se, Si, Ge, or Te is mixed in a reactive gas as impurity raw gas such as $H_2Se$, $SiH_4$, $GeH_4$, $TeH_4$ or the like, and in order to form in p-type conductivity, Mg or Zn is mixed in raw gas as metal organic gas such as cyclopentadienyl magnesium ($Cp_2Mg$) or dimethyl zinc (DMZn).

Although a structure except the active layer 4 is same as a usual one, in an example shown in FIG. 1, a sapphire substrate of an insulating substrate is used as the substrate 1. In case of using the sapphire substrate, as shown in FIG. 1, a buffer layer 2 is generally provided which is made of undoped GaN grown at a low temperature. In addition, the substrate is not limited to the sapphire substrate, and a semiconductor substrate such as a substrate made of SiC, GaN, GaAs, Si, GaP, ZnO or the like can be used. In case of using an insulating substrate such as the sapphire substrate, since an electrode can not be taken out from a back surface of the substrate, it is necessary to expose an underlying conductivity type layer (n-type layer 3 in the example shown in FIG. 1) by etching and removing a part of a semiconductor lamination portion 6, however, in case of using a semiconductor substrate, since conductivity can be obtained by doping, an electrode can be provided directly on the back surface of the substrate as described later.

On the semiconductor lamination portion 6, a light transmitting conductive layer 10 made of, for example, ZnO is provided with a thickness of approximately 0.1 to 10 μm, and on a part thereof an upper electrode (p-side electrode) 11 is formed with a lamination structure of Ti and Au. The light transmitting conductive layer 10 is not limited to ZnO, an ITO layer or a thin alloy layer having a thickness of approximately 2 to 100 nm and made of Ni and Au can be used, and any layer which can diffuse electric current to whole of a chip while transmitting light can be used. In case of a Ni—Au layer, since it is a metal layer, the Ni—Au layer is formed thin because its light transmissivity is lost when formed thick, however the ZnO layer or the ITO layer may be thick because it transmits light. The light transmitting conductive layer 10 is provided to solve problems such that electric current can be hardly diffused to whole surface of a chip because carrier concentration can not be easily raised in the nitride semiconductor layer, especially the p-type nitride semiconductor layer, and it is difficult to get ohmic contact with the upper electrode 11 made with a metal film which is an electrode pad. However, the light transmitting conductive layer 10 may not be necessary if such problems can be solved.

In an example shown in FIG. 1, the p-side electrode 11 is formed on an upper surface because an upper side of the semiconductor lamination portion 6 is the p-type layer, and formed with a lamination structure of, for example, Ti/Au, Pd/Au, Ni—Au or the like, with a thickness of approximately 0.1 to 1 μm in total. In addition, a lower electrode (n-side electrode) 12 is formed on a partially exposed portion of the n-type layer 3 with a Ti—Al alloy, a lamination structure of Ti/Au, or the like with a thickness of approximately 0.1 to 1 μm in total. And, a passivation film not shown in the figure made of $SiO_2$ or the like is provided on a whole surface except surfaces of the p-side electrode 11 and the n-side electrode 12.

Subsequently, a brief explanation of a method for manufacturing the nitride semiconductor light emitting device according to the present invention will be given below using a concrete example. By setting the sapphire substrate 1 within, for example, a MOCVD (metal organic chemical vapor deposition) apparatus, supplying necessary gasses among, for example, trimethyl gallium, trimethyl aluminium (in case of forming an AlGaN based layer), trimethyl indium or ammonia gas as a component gas of a semiconductor layer grown, any one of $H_2Se$, $SiH_4$, $GeH_4$, or $TeH_4$ as an n-type dopant gas, and DMZn or $Cp_2Mg$ as a p-type dopant gas, together with $H_2$ gas as carrier gas, at a temperature of the substrate of 400 to 550° C., for example approximately 450° C., a low temperature buffer layer 2 made of an AlGaN based compound (including a case such that a mixed crystal ratio of Al is zero) is laminated with a thickness of approximately 0.005 to 0.1 μm, and, thereafter at a temperature of the substrate of 800 to 1,200° C., for example approximately 1,065° C., the n-type layer 3 made of GaN is laminated with a thickness of approximately 0.5 μm. Then, the temperature of the substrate is lowered to 600 to 800° C., for example approximately 760° C., and three pairs of the barrier layer 8 made of GaN approximately 5 nm thick, and the well layer 7 formed with the first well layer 7a made of $In_{0.12}Ga_{0.88}N$ approximately 3 nm thick, the thin film barrier layer 7c made of GaN approximately 1.5 nm thick, and the second well layer 7b made of $In_{0.12}Ga_{0.88}N$ approximately 3 nm thick, and further the barrier layer 8 made of GaN approximately 5 nm thick are laminated, thereby the active layer 4 with a multi quantum well (MQW) structure is formed with a thickness of approximately 0.05 μm. Thereafter, the temperature of the substrate is raised to 800 to 1,200° C., for example approximately 1,065° C., by growing sequentially, for example, the p-type layer 7 made of GaN and having a thickness of approximately 0.5 to 2 μm epitaxially, the nitride semiconductor lamination portion 6 is formed. Now, when a concentration of In or Al of the InGaN based compound and the AlGaN based compound is required to be changed, it can be changed by adjusting a flow rate of TMIn of a raw material gas of In or TMA of a raw material gas of Al.

And, after providing a $SiO_2$ protection film on a whole surface of the nitride semiconductor lamination portion, the p-type layer 5 is activated by annealing at a temperature of approximately 400 to 800° C. for approximately 20 to 60 minutes. After finishing annealing, the wafer is set within a sputtering apparatus or a vapor deposition apparatus, and the light transmitting conductive layer 10 made of ZnO is formed with a thickness of approximately 0.3 μm. The ZnO is formed in a film so as to have a specific resistance of approximately (3 to 5)×$10^{-4}$ Ω·cm by doping Ga. Further, the p-side electrode 11 is formed by forming films made of Ti, Al or the like. In addition, the n-side electrode 12 is formed on the n-type layer 3 exposed by etching and removing a part of laminated layers by laminating, for example, Ti/Au, Cr/Pt/Au or the like.

Finally, whole of a chip is covered with a $SiO_2$ film not shown in the figure by a plasma CVD method and opening portions are formed at electrode portions. Thereafter, a light emitting device chip having a structure shown in FIG. 1 is formed by dividing a wafer into chips. In addition, when the wafer is divided into the chips, border portions of the chips of the semiconductor lamination portions 6 are previously etched in a mesa shape by dry etching.

Figure 2:
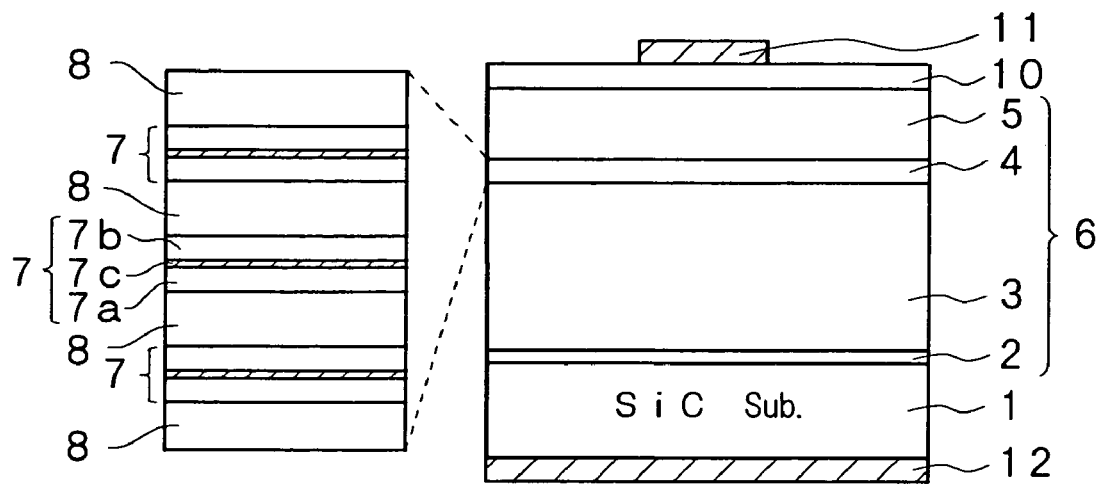
FIG. 2 is an explanatory cross-sectional view of an example which is another structure of the nitride semiconductor device according to the present invention.

In the above-described example, although the sapphire substrate of an insulating material is used as the substrate, also in case of using a semiconductor substrate, by providing the thin film barrier layer in the well layer, a light emitting device with high efficiency can be obtained similarly. A structure of a semiconductor lamination portion is same as the above-described structure, and in case of a semiconductor substrate, as an explanatory cross-sectional figure of an example thereof is shown in FIG. 2, one electrode, for example an n-side electrode 12, can be taken out from a back surface of the substrate. In the example shown in FIG. 2, for example, a SiC substrate is used as the substrate 1, and on the substrate 1, a buffer layer 2 made of AlGaN based compound (including a case such that a mixed crystal ratio of Al is zero), for example an n-type $Al_{0.2}Ga_{0.8}N$ layer, is grown with a thickness of approximately 0.2 μm.

In addition, a composition of the buffer layer 2 is not limited to this example. Then, on the buffer layer 2, an n-type layer 3 made of the GaN based compound doped with Si and with a thickness of approximately 1 to 10 μm, an active layer 4 with a multi quantum well structure including a thin film barrier layer 7c constituted as described above, and a p-type layer made of the GaN based compound doped with Mg and with a thickness of approximately 0.2 to 1 μm, for example approximately 0.25 μm are laminated respectively in order, thereby a nitride semiconductor lamination portion 6 is laminated, and, on the semiconductor lamination portion 6, a light transmitting conductive layer 10 and a p-side electrode 11 are formed similarly to the above-described example, thereafter the SiC substrate 1 is thinned by lapping a back surface side of the SiC substrate 1, and the n-side electrode 12 is formed by forming a metal film made of Ti, Au or the like on the back surface of the substrate 1. Then, a passivation film made of $SiO_2$ or the like not shown in the figure is provided.

In the above-described example, the p-type layer is formed at a surface side because the structure is preferable to anneal for activating the p-type layer. However, also the substrate side may have p-type conductivity depending on the substrate and active layer. In addition, the nitride semiconductor is not limited to the above-described example and may be constituted by a material represented by a general formula $Al_pGa_qIn_{1-p-q}N$ ($0 \leq p \leq 1$, $0 \leq q \leq 1$, $0 \leq p+q \leq 1$). In addition, a compound made by substituting a part of the N with other element of group V element may be used. In addition, although the light emitting layer forming portion is formed with a double hetero junction structure in which the active layer is sandwiched by the n-type layer and the p-type layer, other semiconductor layer such as a guide layer or the like may be interposed further between any layers.

Further, although the above describe example is that of LED, also in case of a semiconductor laser, internal quantum efficiency can be enhanced similarly by providing a thin film barrier layer within the well layer of the active layer.

As described above, according to the present invention, since the thin film barrier layer having a larger band gap energy than that of the well layer is provided within the well layer of the active layer, and the well layer is divided into the first well layer and the second well layer, even if a width of the well layer is large (film thickness is large), distances between electrons and holes are close and recombination radiation can be generated easily. As a result, the recombination of electrons and holes is generated efficiently, internal quantum efficiency can be significantly improved with a small useless current, thereby a LED or a LD with high efficiency in a wide wavelength band from ultraviolet to yellow light can be manufactured.

INDUSTRIAL APPLICABILITY

Characteristics of a light emitting device using nitride semiconductor, such as a LED and a laser diode can be improved and the nitride semiconductor light emitting device can be used in every kinds of electronic apparatus using such semiconductor light emitting devices.

What is claimed is:

1. A nitride semiconductor light emitting device comprising:
    a substrate; and
    a nitride semiconductor lamination portion provided on the substrate, the nitride semiconductor lamination portion comprising an active layer in which at least a light emitting portion is formed, the active layer being constituted with a multiple quantum well structure formed by laminating well layers made of $In_xGa_{1-x}N$ ($0 < x \leq 1$) and barrier layers made of $Al_yIn_zGa_{1-y-z}N$ ($0 \leq y < 1$, $0 \leq z < 1$, $0 \leq y+z < 1$, $z < x$) alternately,
    wherein one of the well layers is divided at least into a first well layer and a second well layer by a thin film barrier layer made of $Al_vIn_wGa_{1-v-w}N$ ($0 \leq v < 1$, $0 \leq w < 1$, $0 \leq v+w < 1$, $w < x$), the thin film barrier layer being formed so as to have a thickness of one atomic layer or more and 20 Angstroms or less,
    wherein each of the first well layer and the second well layer has a thickness that is ($b_1$+10) Angstroms or more and 100 Angstroms or less, and
    wherein the thickness of the film barrier layer is $b_1$ Angstroms, and a thickness of the barrier layer is 50 Angstroms or more and 100 Angstroms or less.

2. The nitride semiconductor light emitting device according to claim 1, wherein the thickness of the thin film barrier layer is 15 Angstroms or less.

3. The nitride semiconductor light emitting device according to claim 1, wherein the well layers of the active layer are formed so as to have a band gap energy emitting green light or yellow light.

4. The nitride semiconductor light emitting device according to claim 3, wherein the thin film barrier layer is made of a material having a band gap energy larger than that of the well layers by 0.4 eV or more.

5. The nitride semiconductor light emitting device according to claim 1, wherein the thin film barrier layer is formed at the middle of one well layer.

6. The nitride semiconductor light emitting device according to claim 1, wherein one of the well layers is divided into three or more by forming two or more thin film barrier layers.

7. The nitride semiconductor light emitting device according to claim 1, wherein one of the barrier layers is formed with a thickness of 3 to 20 nm and the one well layer is formed so that a total thickness of each well layer divided by the thin film barrier layer is approximately equal to a thickness of the one of the barrier layers.

8. A nitride semiconductor light emitting device comprising:
   a substrate; and
   a nitride semiconductor lamination portion provided on the substrate, the nitride semiconductor lamination portion comprising an active layer in which at least a light emitting portion is formed, the active layer being constituted with a multiple quantum well structure formed by laminating well layers made of $In_xGa_{1-x}N$ ($0<x\leq1$) and barrier layers made of $Al_yIn_zGa_{1-y-z}N$ ($0\leq y<1$, $0\leq z<1$, $0\leq y+z<1$, $z<x$) alternately,
   wherein one of the well layers is divided at least into a first well layer and a second well layer by a thin film barrier layer made of $Al_vIn_xGa_{1-v-w}N$ ($0\leq v<1$, $0\leq w<1$, $0\leq v+w<1$, $w<x$), the thin film barrier layer being formed so as to have a thickness that is one atomic layer or more and 20 Angstroms or less, and
   wherein one of the barrier layers is formed with a thickness of 3 to 20 nm and the one well layer is formed so that a total thickness of each well layer divided by the thin film barrier layer is approximately equal to a thickness of the one of the barrier layers.

9. The nitride semiconductor light emitting device according to claim 8, wherein the thickness of the thin film barrier layer is 15 Angstroms or less.

10. The nitride semiconductor light emitting device according to claim 8, wherein the well layers of the active layer are formed so as to have a band gap energy emitting green light or yellow light.

11. The nitride semiconductor light emitting device according to claim 10, wherein the thin film barrier layer is made of a material having a band gap energy larger than that of the well layers by 0.4 eV or more.

12. The nitride semiconductor light emitting device according to claim 8, wherein the thin film barrier layer is formed at the middle of one well layer.

13. The nitride semiconductor light emitting device according to claim 8, wherein one of the well layers is divided into three or more by forming two or more thin film barrier layers.

* * * * *